United States Patent
Weng

(10) Patent No.: US 11,468,820 B2
(45) Date of Patent: Oct. 11, 2022

(54) CONTROL CIRCUIT CONFIGURATION FOR SHIFT REGISTER UNIT, GATE DRIVING CIRCUIT AND DISPLAY DEVICE, AND METHOD FOR DRIVING THE SHIFT REGISTER UNIT

(71) Applicants: FUZHOU BOE OPTOELECTRONICS TECHNOLOGY CO., LTD., Fuzhou (CN); BOE TECHNOLOGY GROUP CO., LTD., Beijing (CN)

(72) Inventor: Zuwei Weng, Beijing (CN)

(73) Assignees: FUZHOU BOE OPTOELECTRONICS TECHNOLOGY CO., LTD., Fujian (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 322 days.

(21) Appl. No.: 16/621,217
(22) PCT Filed: Jul. 12, 2019
(86) PCT No.: PCT/CN2019/095793
§ 371 (c)(1),
(2) Date: Dec. 10, 2019
(87) PCT Pub. No.: WO2020/052343
PCT Pub. Date: Mar. 19, 2020

(65) Prior Publication Data
US 2021/0366353 A1 Nov. 25, 2021

(30) Foreign Application Priority Data
Sep. 11, 2018 (CN) .......................... 201811056464.9

(51) Int. Cl.
G09G 5/00 (2006.01)
G09G 3/20 (2006.01)
(Continued)

(52) U.S. Cl.
CPC ......... *G09G 3/2092* (2013.01); *G09G 3/3225* (2013.01); *G09G 3/3266* (2013.01);
(Continued)

(58) Field of Classification Search
CPC .. G09G 3/2092; G09G 3/3225; G09G 3/3677; G09G 2300/0426;
(Continued)

(56) References Cited

U.S. PATENT DOCUMENTS 8,054,935 B2   11/2011   Tsai
8,149,985 B2   4/2012   Tsai
(Continued)

FOREIGN PATENT DOCUMENTS

CN   101075481 A   11/2007
CN   101866697 A   10/2010
(Continued)

*Primary Examiner* — Adam J Snyder
(74) *Attorney, Agent, or Firm* — Kinney & Lange, P.A.

(57) ABSTRACT

The present disclosure provides a shift register unit and a method for driving the same, a gate driving circuit and a display device. The shift register unit includes: an input sub-circuit configured to receive an input control signal and an input signal, and transmit the input signal to a first pull-down node of the shift register unit under control of the input control signal; a first control sub-circuit configured to receive a first clock signal and electrically couple the first pull-down node to a second pull-down node of the shift register unit under control of the first clock signal; and an output sub-circuit configured to receive a first constant voltage signal and transmit the first constant voltage signal to an output terminal of the shift register unit under control of a voltage at the second pull-down node.

18 Claims, 11 Drawing Sheets

(51) Int. Cl.
  *G09G 3/3225* (2016.01)
  *G09G 3/36* (2006.01)
  *G11C 19/28* (2006.01)
  *G09G 3/3266* (2016.01)

(52) U.S. Cl.
  CPC ... *G09G 3/3677* (2013.01); *G09G 2300/0426* (2013.01); *G09G 2310/0286* (2013.01); *G09G 2310/061* (2013.01); *G09G 2310/08* (2013.01); *G11C 19/28* (2013.01)

(58) Field of Classification Search
  CPC ..... G09G 2310/0286; G09G 2310/061; G09G 2310/08; G09G 3/3266; G11C 19/28
  See application file for complete search history.

(56) References Cited

U.S. PATENT DOCUMENTS

| | | | |
|---|---|---|---|
| 8,184,764 B1 | 5/2012 | Tsai | |
| 8,290,114 B2 | 10/2012 | Tsai | |
| 8,605,029 B2 | 12/2013 | Ohhashi | |
| 8,842,803 B2 | 9/2014 | Jang | |
| 2011/0116592 A1* | 5/2011 | Tsai | G11C 19/184 377/79 |
| 2012/0008732 A1 | 1/2012 | Tsai | |
| 2012/0098804 A1 | 4/2012 | Ohhashi | |
| 2012/0140872 A1 | 6/2012 | Tsai | |
| 2012/0213323 A1 | 8/2012 | Tsai | |
| 2014/0044228 A1 | 2/2014 | Jang | |
| 2014/0133621 A1* | 5/2014 | Shang | G11C 19/28 377/67 |
| 2017/0278450 A1* | 9/2017 | Ma | G09G 3/3266 |
| 2019/0251887 A1 | 8/2019 | Xue et al. | |

FOREIGN PATENT DOCUMENTS

| | | | | |
|---|---|---|---|---|
| CN | 102460587 A | | 5/2012 | |
| CN | 103578395 A | | 2/2014 | |
| CN | 105741802 A | * | 7/2016 | ........... G09G 3/3266 |
| CN | 108053801 A | | 5/2018 | |
| CN | 108806636 A | | 11/2018 | |
| KR | 20140096613 A | | 8/2014 | |

* cited by examiner

CONTROL CIRCUIT CONFIGURATION FOR SHIFT REGISTER UNIT, GATE DRIVING CIRCUIT AND DISPLAY DEVICE, AND METHOD FOR DRIVING THE SHIFT REGISTER UNIT

CROSS-REFERENCE TO RELATED APPLICATION(S)

This application is the national phase of PCT Application No. PCT/CN2019/095793 filed on Jul. 12, 2019, which in turn claims priority to the Chinese Patent Application No. 201811056464.9, filed on Sep. 11, 2018, which is incorporated herein by reference in its entirety.

TECHNICAL FIELD

The present disclosure relates to the field of display technology, and more particularly, to a shift register unit and a method for driving the same, a gate driving circuit, and a display device.

BACKGROUND

In Thin Film Transistor (TFT) based display technology, for example, in an Organic Light Emitting Diode (OLED) display, a gate driving circuit may comprise a plurality of cascaded shift register units, wherein each of the shift register units generates output signals having a high level and a low level to drive pixel units on a display panel. Generally, at least one of the high level and the low level is provided by a clock signal, which may, in some cases, make levels of the output signals unstable.

SUMMARY

The present disclosure proposes a shift register unit and a method for driving the same, a gate driving circuit, and a display device.

According to an aspect of the present disclosure, there is provided a shift register unit, comprising:

an input sub-circuit electrically coupled to a first pull-down node of the shift register unit, and configured to receive an input control signal and an input signal, and transmit the input signal to the first pull-down node of the shift register unit under control of the input control signal;

a first control sub-circuit electrically coupled to the first pull-down node and a second pull-down node of the shift register unit, and configured to receive a first clock signal and electrically couple the first pull-down node to the second pull-down node of the shift register unit under control of the first clock signal; and an output sub-circuit electrically coupled to the second pull-down node, the first pull-down node, and an output terminal of the shift register unit, and configured to receive a first constant voltage signal and transmit the first constant voltage signal to the output terminal of the shift register unit to be output as an output signal based on a voltage at the first pull-down node under control of a voltage at the second pull-down node.

In an example, the shift register unit further comprises:

a second control sub-circuit electrically coupled to the second pull-down node and a pull-up node of the shift register unit, and configured to receive the first constant voltage signal, a second constant voltage signal, and a second clock signal and transmit the first constant voltage signal or the second constant voltage signal to the pull-up node of the shift register unit under control of the second clock signal and the voltage at the second pull-down node.

In an example, the output sub-circuit is further electrically coupled to the pull-up node, and the output sub-circuit is further configured to receive the second constant voltage signal and transmit the second constant voltage signal to the output terminal to be output as the output signal under control of a voltage at the pull-up node.

In an example, the shift register unit further comprises:

a reset sub-circuit electrically coupled to the second pull-down node, and configured to receive a reset control signal and a second constant voltage signal, and reset the second pull-down node using the second constant voltage signal under control of the reset control signal.

In an example, the input sub-circuit comprises a first transistor having a gate electrically coupled to receive the input control signal, a first electrode electrically coupled to receive the input signal, and a second electrode electrically coupled to the first pull-down node. In an example, the input control signal is a second clock signal or the input signal.

In an example, the first control sub-circuit comprises a second transistor having a gate electrically coupled to receive the first clock signal, a first electrode electrically coupled to the first pull-down node, and a second electrode electrically coupled to the second pull-down node.

In an example, the output sub-circuit comprises a third transistor, a fourth transistor, and a first capacitor, wherein the third transistor has a gate electrically coupled to the second pull-down node, a first electrode electrically coupled to receive the first constant voltage signal, and a second electrode electrically coupled to the output terminal;

the fourth transistor has a gate electrically coupled to the pull-up node, a first electrode electrically coupled to receive the second constant voltage signal, and a second electrode electrically coupled to the output terminal; and the first capacitor has a first terminal electrically coupled to the first pull-down node, and a second terminal electrically coupled to the output terminal.

In an example, the output sub-circuit further comprises a second capacitor having a first terminal electrically coupled to the pull-up node, and a second terminal electrically coupled to receive the second constant voltage signal.

In an example, the second control sub-circuit comprises a fifth transistor and a sixth transistor, wherein the fifth transistor has a gate electrically coupled to receive the second clock signal, a first electrode electrically coupled to receive the first constant voltage signal, and a second electrode electrically coupled to the pull-up node; and the sixth transistor has a gate electrically coupled to the second pull-down node, a first electrode electrically coupled to receive the second constant voltage signal, and a second electrode electrically coupled to the pull-up node.

In an example, the reset sub-circuit comprises a seventh transistor having a gate electrically coupled to receive the reset control signal, a first electrode electrically coupled to receive the second constant voltage signal, and a second electrode electrically coupled to the second pull-down node.

In an example, the reset control signal is a second clock signal.

In an example, the reset sub-circuit further comprises an eighth transistor having a gate electrically coupled to receive the reset control signal, a first electrode electrically coupled to receive the second constant voltage signal, and a second electrode electrically coupled to the first pull-down node.

In an example, the reset control signal is an output signal from another shift register unit.

According to another aspect of the present disclosure, there is provided a gate driving circuit comprising N stages of cascaded shift register units described above, wherein an $n^{th}$ stage of shift register unit receives an output signal from an $(n-1)^{th}$ stage of shift register unit as an input signal of the $n^{th}$ stage of shift register unit, where n and N are integers, N≥2, and 2≤n≤N. In an example, each stage of shift register unit receives a second clock signal as a reset control signal; or the $n^{th}$ stage of shift register unit receives an output signal from an $(n+1)^{th}$ stage of shift register unit as a reset control signal of the $n^{th}$ stage of shift register unit.

According to yet another aspect of the present disclosure, there is provided a method for driving the shift register unit described above, comprising:

transmitting, in an input period, by the input sub-circuit, an input signal at a first level to the first pull-down node under control of an input control signal; and electrically coupling, in an output period, by the first control sub-circuit, the first pull-down node to the second pull-down node under control of a first clock signal, and causing, by a voltage at the second pull-down node, the output sub-circuit to transmit a first constant voltage signal to the output terminal of the shift register unit to be output as an output signal.

In an example, the shift register unit further comprises a reset sub-circuit and a second control sub-circuit, the method further comprising:

resetting, in a reset period, by the reset sub-circuit, the second pull-down node using a second constant voltage signal under control of a reset control signal, causing, by the voltage at the second pull-down node, the second control sub-circuit to transmit the first constant voltage signal to the pull-up node of the shift register unit under control of a second clock signal, and causing, by a voltage at the pull-up node, the output sub-circuit to transmit the second constant voltage signal to the output terminal to be output as an output signal.

In an example, at least one of the reset control signal or the input control signal is the second clock signal.

According to still another aspect of the present disclosure, there is provided a display device comprising the gate driving circuit described above.

BRIEF DESCRIPTION OF THE ACCOMPANYING DRAWINGS

In order to more clearly illustrate the technical solutions in the embodiments of the present disclosure or in the related art, the accompanying drawings to be used in the description of the embodiments will be briefly described below. Obviously, the accompanying drawings in the following description are only some embodiments of the present disclosure, and other accompanying drawings may be obtained by those of ordinary skill in the art according to the accompanying drawings without any creative work. In the accompanying drawings, FIG. 1 illustrates a schematic block diagram of a shift register unit in the related art.

DETAILED DESCRIPTION

Figure 1:
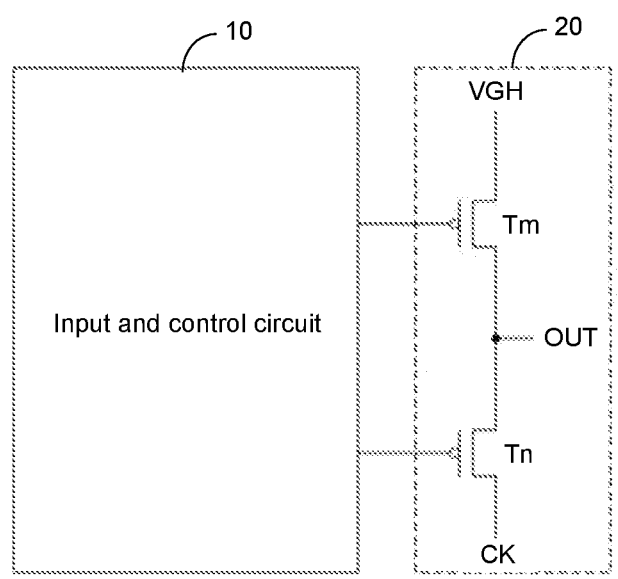

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "coupled" or "electrically coupled" may mean that two components are directly coupled or electrically coupled, or that two components are coupled or electrically coupled via one or more other components. In addition, the two components may be coupled or electrically coupled by wire or wirelessly. Hereinafter, when "A is coupled to B" is mentioned, not only a case where "A is electrically coupled to B" is included, but also a case where "A is coupled to B by other means" is included.

The transistors used in the embodiments of the present disclosure may each be a thin film transistor or a field effect transistor or other devices having the same characteristics. According to functions of the transistors in a circuit, the transistors used in the embodiments of the present disclosure are primarily switch transistors. Since a source and a drain of the thin film transistor used herein are symmetrical, the source and the drain thereof may be interchanged. In the embodiments of the present disclosure, one of the source and the drain is referred to as a first electrode, and the other of the source and the drain is referred to as a second electrode. In the following examples, the description is made by taking a P-type thin film transistor as an example. Similarly, in other embodiments, the technical solutions according to the present disclosure may also be implemented by using an N-type thin film transistor. It may be understood by those skilled in the art that the technical solutions according to the present disclosure may also be implemented by inverting (and/or making other adaptive amendments to) an input signal, a reset signal, a clock signal and a constant voltage signal.

Further, in the description of the embodiments of the present disclosure, the terms "active level" and "inactive level" are levels at which relevant transistors are turned on and turned off respectively. In the present disclosure, a "first active level" and a "second inactive level" are only used to distinguish magnitudes of the two active levels from each other. Hereinafter, since a P-type thin film transistor is used as an example, the "active level" and a "first level" are low levels, and the "inactive level" and a "second level" are high levels.

Accordingly, hereinafter, a "first constant voltage signal" for providing an active driving level is shown as a low level signal vgl, and a "second constant voltage signal" for providing an inactive driving level is shown as a high level signal vgh.

Hereinafter, for convenience of description, uppercase letters are used to identify signal terminals for receiving or transmitting signals or signal terminals, and lowercase letters are used to identify signals received or transmitted at corresponding signal terminals or signal terminals. For example, CON denotes a first control signal terminal for providing a first control signal, and con denotes the first control signal.

The present disclosure will be described in detail below with reference to the accompanying drawings.

FIG. 1 illustrates a schematic block diagram of a shift register unit in the related art.

As shown in FIG. 1, the shift register unit comprises an input and control circuit 10 and an output circuit 20. The output circuit 20 comprises two control transistors Tm and Tn, which control signals from a power supply signal terminal VGH (which provides an inactive level) and a clock signal terminal CK (which provides an active level) to be output to an output terminal OUT respectively under control of a control signal from the input and control circuit 10. For the shift register unit in FIG. 1, there is a case where the transistor Tm is turned on but the transistor Tn is turned off at a certain time, and at this time, a level of a signal output at the output terminal OUT is equal to a level at the clock signal terminal CK, for example, vgh_1. There is a case where the transistors Tm and Tn are turned on at the same time, and at this time, the level of the signal output at the output terminal OUT is equal to a value of a sum of levels of a signal at the power signal terminal VGH and a signal at the clock signal terminal CK. If at this time, both the signal at the power signal terminal VGH and the signal at the clock signal terminal CK are at a high level and there is a large deviation in amplitude of the high level of the signal at the power signal terminal VGH relative to the high level of the signal at the clock signal terminal CK, the high level output at the output terminal OUT is between vgh_1 and the active value, for example, is equal to vgh_2. Thereby, when the active output level output at the output terminal OUT is provided by the clock signal, there is a deviation and fluctuation in high level values of the signal output at the output terminal OUT at different times, which reduces reliability of a gate driving circuit.

Figure 2:
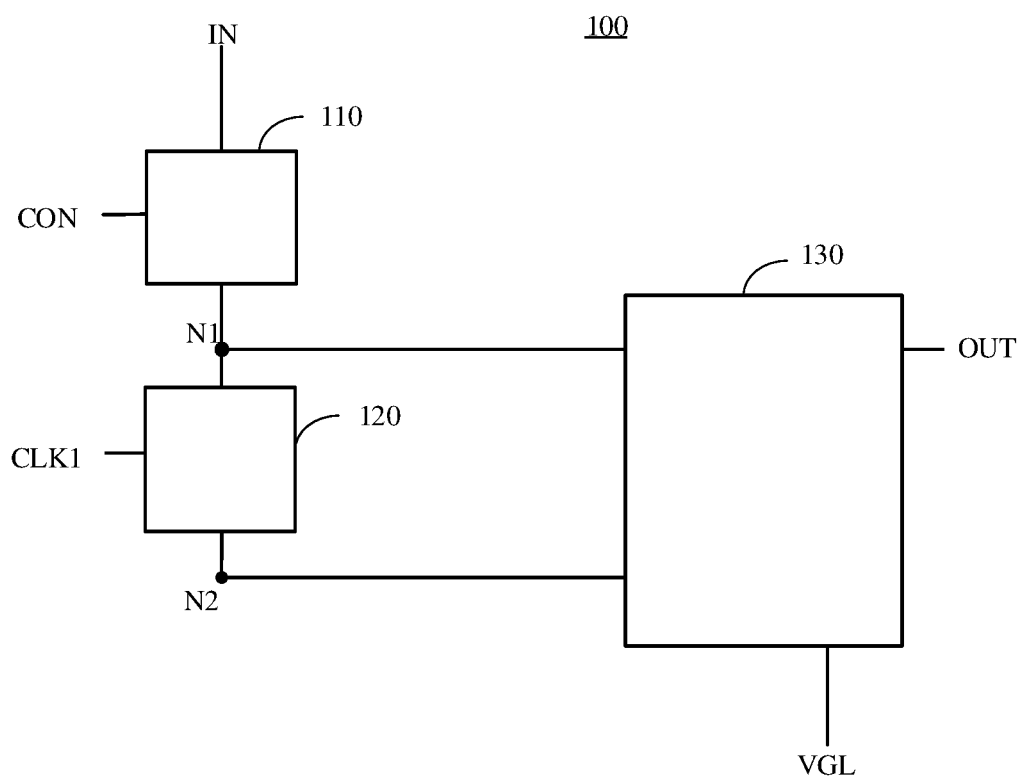
FIG. 2 illustrates a structural block diagram of a shift register unit according to an embodiment of the present disclosure.

FIG. 2 illustrates a structural block diagram of a shift register unit 100 according to an embodiment of the present disclosure.

As seen in FIG. 2, the shift register unit 100 comprises an input sub-circuit 110, a first control sub-circuit 120, and an output sub-circuit 130. It may be understood by those skilled in the art that one or more of these sub-circuits may be omitted, or other sub-circuits may be added, or modifications may be made to the respective sub-circuits, or any combination thereof, which fall within the protection scope of the present disclosure.

The input sub-circuit 110 may be coupled to an input control signal terminal CON to receive an input control signal, may be coupled to an input signal terminal IN to receive an input signal, and may be coupled to a first pull-down node N1. The input sub-circuit 110 may transmit the input signal to the first pull-down node N1 under control of the input control signal received at the input signal terminal IN.

The first control sub-circuit 120 may be coupled to a first clock signal terminal CLK1 to receive a first clock signal, and may be coupled to the first pull-down node N1 and a second pull-down node N2. The first control sub-circuit 120 may electrically couple the first pull-down node N1 to the second pull-down node N2 under control of the first clock signal received at the first clock signal terminal CLK1. For example, when the first clock signal causes the first control sub-circuit 120 to be turned on, the first pull-down node N1 is electrically coupled to the second pull-down node N2.

The output sub-circuit 130 may be coupled to the second pull-down node N2, may be coupled to a first constant voltage signal terminal VGL to receive a first constant voltage signal, may be coupled to the first pull-down node N1, and may be coupled to an output terminal OUT of the shift register 100 to output an output signal. The output sub-circuit 130 may transmit the first constant voltage signal received at the first constant voltage signal terminal VGL to the signal output terminal OUT to be output as an output signal based on a voltage at the first pull-down node N1 under control of a voltage at the second pull-down node N2.

In the embodiment shown in FIG. 2, with the introduction of the first control sub-circuit 120, a desired active output level may be provided by a constant voltage signal instead of a clock signal, which improves the stability of the output signal.

Figure 3:
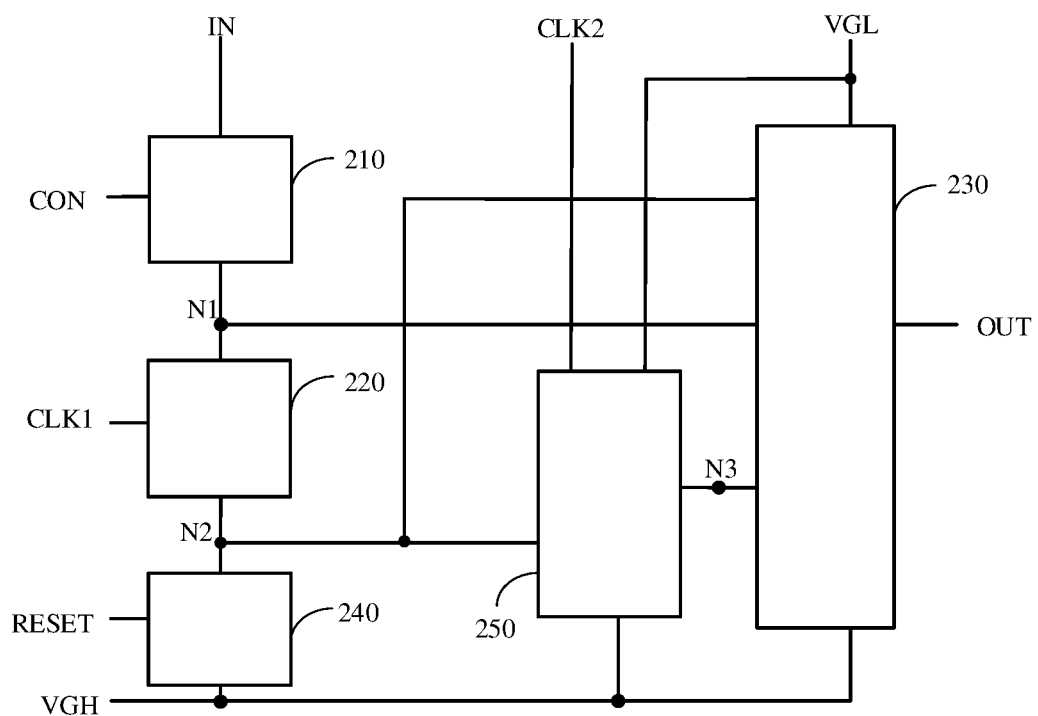
FIG. 3 illustrates a structural block diagram of a shift register unit according to another embodiment of the present disclosure.

FIG. 3 illustrates a structural block diagram of a shift register unit 200 according to another embodiment of the present disclosure.

As seen in FIG. 3, the shift register unit 200 comprises an input sub-circuit 210, a first control sub-circuit 220, an output sub-circuit 230, a reset sub-circuit 240, and a second control sub-circuit 250. It may be understood by those skilled in the art that one or more of these sub-circuits may be omitted, or other sub-circuits may be added, or modifications may be made to the respective sub-circuits, or any combination thereof, which fall within the protection scope of the present disclosure.

The input sub-circuit 210, the first control sub-circuit 220 and the output sub-circuit 230 of the shift register unit 200 in FIG. 3 may be implemented as the input sub-circuit 110, the first control sub-circuit 120 and the output sub-circuit 130 of the shift register unit 100 in FIG. 2 respectively, and description of these sub-circuits will not be repeated here.

Based on the above structure, the output sub-circuit 230 may further be coupled to a pull-up node N3, and may be coupled to a second constant voltage signal terminal VGH to receive a second constant voltage signal.

The reset sub-circuit 240 may be coupled to a reset control signal terminal RESET to receive a reset control signal, may be coupled to the second constant voltage signal terminal VGH to receive the second constant voltage signal, and may be coupled to the second pull-down node N2. The reset sub-circuit 240 may reset the second pull-down node N2 using the second constant voltage signal received at the second constant voltage signal terminal VGH under control of the reset control signal received at the reset control signal terminal VGH.

In some embodiments, the reset sub-circuit 240 may further be coupled to the first pull-down node N1. Thereby, the reset sub-circuit 240 may further reset the first pull-down node N1 using the second constant voltage signal under control of the reset control signal.

The second control sub-circuit 250 may be coupled to a second clock signal terminal CLK2 to receive a second clock signal, may be coupled to the second pull-down node N2, may be coupled to the first constant voltage signal terminal VGL to receive the first constant voltage signal, may be coupled to the second constant voltage signal terminal VGH to receive the second constant voltage signal, and may be coupled to the pull-up node N3. The second control sub-circuit 250 may transmit the first constant voltage signal at the first constant voltage signal terminal VGL or the second constant voltage signal at the second constant voltage signal terminal VGH to the pull-up node N3 under control of the voltages at the second clock signal terminal CLK2 and the second pull-down node N2.

In the embodiment shown in FIG. 3, with the introduction of the second control sub-circuit 250, a desired output level may be provided by a constant voltage signal, which improves the stability of the output signal of the shift register unit.

Figure 4:
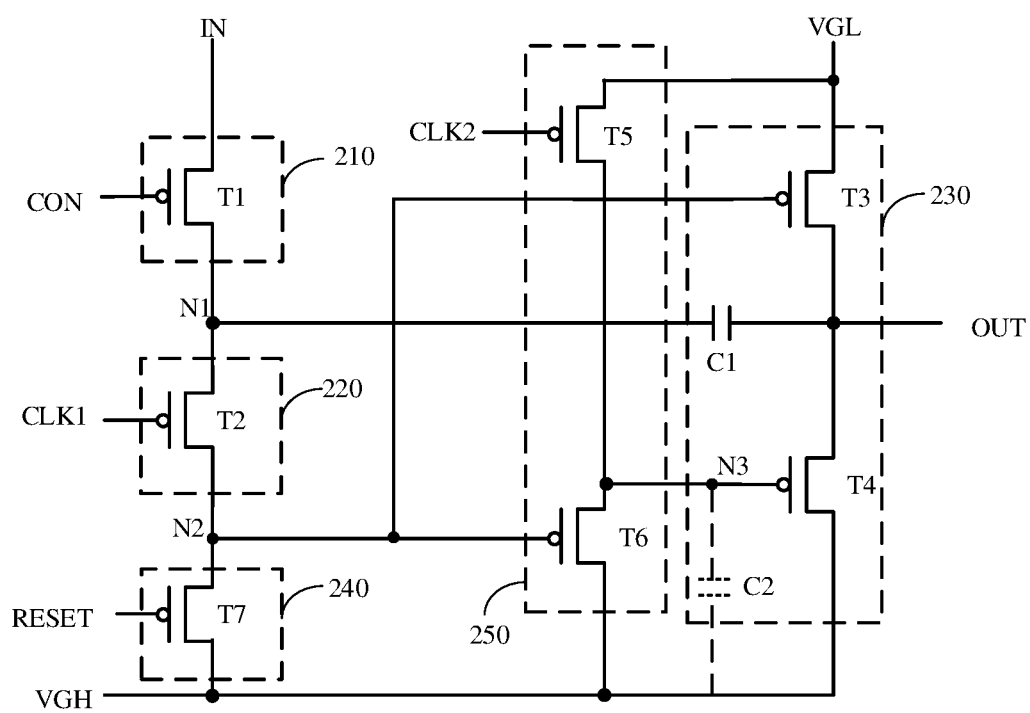
FIG. 4 illustrates a circuit diagram of a shift register unit according to an embodiment of the present disclosure.

FIG. 4 illustrates a circuit diagram of a shift register unit according to an embodiment of the present disclosure.

As shown in FIG. 4, the input sub-circuit 210 comprises a first transistor T1. The first transistor T1 has a gate coupled to the input control signal terminal CON, a first electrode coupled to the input signal terminal IN, and a second electrode coupled to the first pull-down node N1. Thereby, the first transistor T1 is turned on or turned off under control of the input control signal received at the input control signal terminal CON, and in a case where the first transistor T1 is turned on (the input control signal terminal CON is at a low level), the first transistor T1 inputs an input signal received at the input signal terminal IN to the first pull-down node N1.

In the present embodiment, the input control signal terminal CON may be coupled to the second clock signal terminal CLK2, so that the input control signal may be realized by a second clock signal.

The first control sub-circuit 220 comprises a second transistor T2. The second transistor T2 has a gate coupled to the first clock signal terminal CLK1, a first electrode coupled to the first pull-down node N1, and a second electrode coupled to the second pull-down node N2. Thereby, the second transistor T2 is turned on or turned off under control of a first clock signal received at the first clock signal terminal CLK1. In a case where the second transistor T2 is turned on, the second transistor T2 electrically couples the first pull-down node N1 to the second pull-down node N2. In a case where the second transistor T2 is turned off, the second transistor T2 electrically isolates the first pull-down node N1 from the second pull-down node N2.

The output sub-circuit 230 comprises a third transistor T3, a fourth transistor T4, and a first capacitor C1. The third transistor T3 has a gate coupled to the second pull-down node N2, a first electrode coupled to the first constant voltage signal terminal VGL, and a second electrode coupled to the output terminal OUT. Thereby, the third transistor T3 is turned on or turned off under control of a voltage at the second pull-down node N2. In a case where the third transistor T3 is turned on, the third transistor T3 transmits a first constant voltage signal received at the first constant voltage signal terminal VLG to the signal output terminal OUT to be output as an output signal.

The fourth transistor T4 has a gate coupled to the pull-up node N3, a first electrode coupled to the second constant voltage signal terminal VGH, and a second electrode coupled to the output terminal OUT. Thereby, the fourth transistor T4 is turned on or turned off under control of a voltage at the pull-up node N3. In a case where the fourth transistor T4 is turned on, the fourth transistor T4 transmits a second constant voltage signal received at the second constant voltage signal terminal VGH to the signal output terminal OUT to be output as an output signal.

The first capacitor C1 has a first terminal coupled to the first pull-down node N1, and a second terminal coupled to the output terminal OUT. The first capacitor C1 is used to maintain a voltage difference between the first pull-down node N1 and the output terminal OUT, and enable formation of a gate-source voltage for causing the third transistor T3 to be turned on in a case where the first control sub-circuit 220 is turned on, so as to maintain a stable output at an active level for a certain period of time.

Also shown in FIG. 4 is that output sub-circuit 230 comprises a second capacitor C2. It should be understood that in other embodiments, the second capacitor C2 may not be included, and therefore C2 and its coupling relationship with the circuit are shown by dashed lines in FIG. 3. The second capacitor C2 may have a first terminal coupled to the pull-up node N3, and a second terminal coupled to the second constant voltage signal terminal VGH. Thereby, the second capacitor C2 may be used to maintain a voltage difference between the pull-up node N3 and the second constant voltage signal terminal VGH in certain phases.

The second control sub-circuit 250 comprises a fifth transistor T5 and a sixth transistor T6. The fifth transistor T5 has a gate coupled to the second clock signal terminal CLK2, a first electrode coupled to the first constant voltage signal terminal VGL, and a second electrode coupled to the output terminal OUT. Thereby, the fifth transistor T5 is turned on or turned off under control of the second clock signal received at the second clock signal terminal CLK2. In a case where the fifth transistor T5 is turned on, the fifth transistor T5 transmits the first constant voltage signal received at the first constant voltage signal terminal VGL to the pull-up node N3. The sixth transistor T6 has a gate coupled to the second pull-down node N2, a first electrode coupled to the second constant voltage signal terminal VGH, and a second electrode coupled to the output terminal OUT. Thereby, the sixth transistor T6 is turned on or turned off under control of the voltage at the second pull-down node N2. In a case where the sixth transistor T6 is turned on, the sixth transistor T6 transmits the second constant voltage signal received at the second constant voltage signal terminal VGH to the pull-up node N3.

An active or inactive level may be provided to the pull-up node N3 by controlling turn-on or turn-off of the fifth transistor T5 and the sixth transistor T6, so as to control the transmission of the second constant voltage signal to the output terminal OUT.

The reset sub-circuit 240 comprises a seventh transistor T7. The seventh transistor T7 has a gate coupled to the reset control signal terminal RESET to receive the reset control signal, a first electrode coupled to the second constant voltage signal terminal VGH to receive the second constant voltage signal, and a second electrode coupled to the second pull-down node N2. Thereby, the seventh transistor T7 is turned on or turned off under control of the reset control signal received at the reset control signal terminal RESET. In a case where the seventh transistor T7 is turned on, the seventh transistor T7 transmits the second constant voltage signal received at the second constant voltage signal terminal VGH to the second pull-down node N2 to reset the second pull-down node N2.

In the present embodiment, the reset control signal terminal RESET may be coupled to the second clock signal terminal CLK2, so that the reset control signal is provided by the second clock signal.

Figure 5:
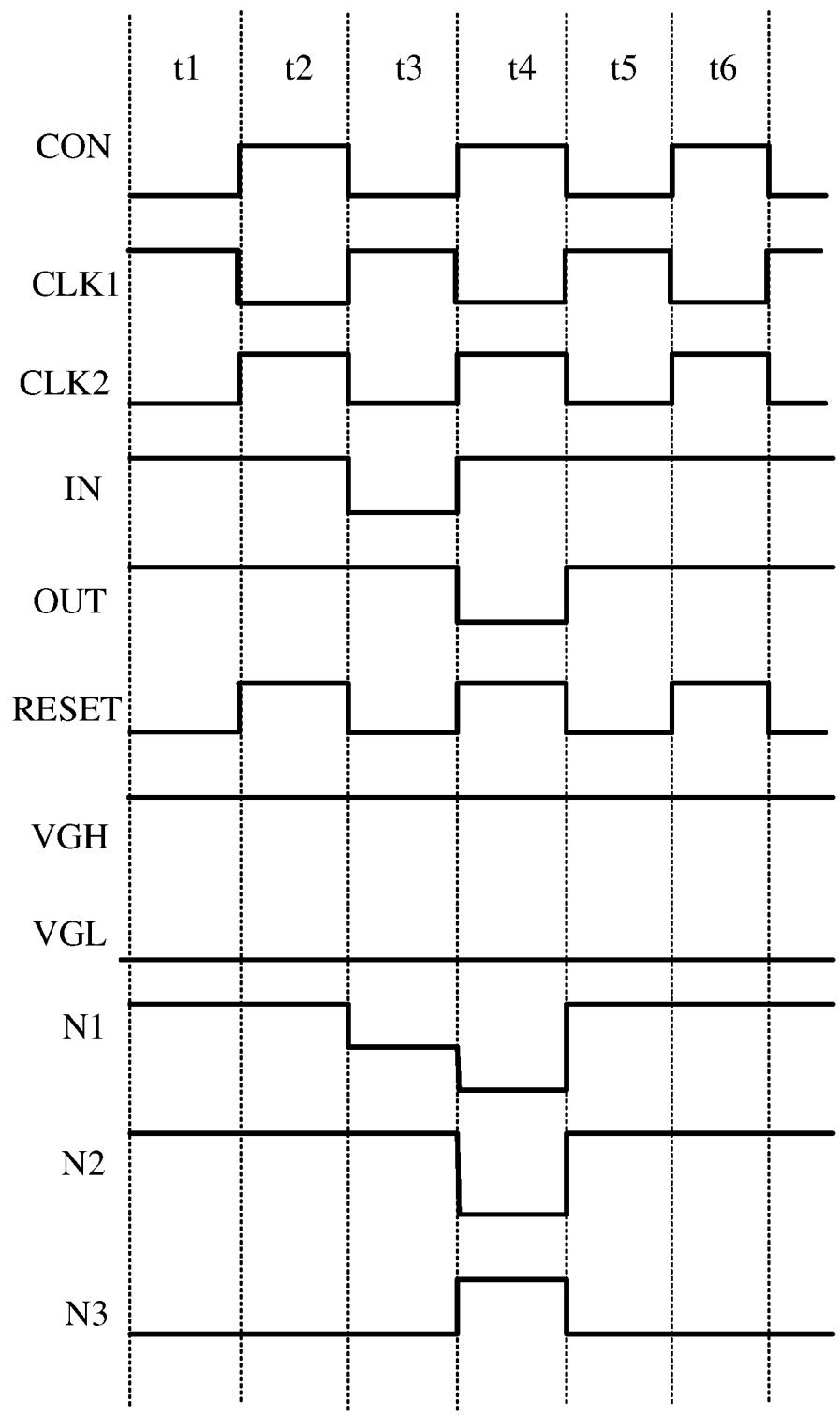
FIG. 5 illustrates a signal timing diagram of the shift register unit in FIG. 4.

FIG. 5 illustrates a signal timing diagram of the shift register unit 200 in FIG. 4. An operation of the shift register unit 200 in FIG. 4 will be described below in conjunction with FIG. 5. In FIG. 5, the second clock signal terminal CLK2, the input control signal terminal CON, and the reset control signal terminal RESET may be coupled together or implemented as one signal terminal to have the same signal waveform, that is, the input control signal and the reset control signal are both implemented by the second clock signal. The first clock signal provided at the first clock signal terminal CLK1 may be an inversion of the second clock signal provided at the second clock signal terminal CLK2.

In a period t1, the input signal received at the input signal terminal IN is at a high level, the input control signal terminal CON, the second clock signal terminal CLK2, and the reset control signal terminal RESET are all at a low level, and the first transistor T1, the seventh transistor T7 and the fifth transistor T5 are turned on, to transmit a high level of the input signal to the first pull-down node N1, transmit a high level at the second constant voltage signal terminal VGH to the second pull-down node N2, and transmit a low level at the first constant voltage signal terminal VGL to the pull-up node N3. The low level at the pull-up node N3 causes the fourth transistor T4 to be turned on, to transmit the high level at the second constant voltage signal terminal VGH to the output terminal OUT.

In a period t2, the first clock signal terminal CLK1 is at a high level, the second clock signal terminal CLK2 is at a low level, the second transistor T2 is turned on, the first transistor T1, the fifth transistor T5, and the seventh transistor T7 are turned off, the first pull-down node N1 is still at a high level due to the presence of the first capacitor C1, and the high level at the first pull-down node N1 is transmitted to the second pull-down node N2 since the second transistor T2 is turned on. The third transistor T3 and the sixth transistor T6 are still maintained to be in a turn-off state by the high level at the second pull-down node N2. The pull-up node N3 is maintained at a low level due to the presence of the second capacitor C2, so that the fourth transistor T4 continues to maintain the output terminal OUT at a high level. In some embodiments, if the second capacitor C2 is not separately provided, the pull-up node N3 may be maintained to be at a low level by parasitic capacitance in the circuit. Signal stability may be improved by providing the second capacitor C2.

With the operations in the periods t1 and t2 described above, in a period during which the active level (i.e., the low level) at the input signal terminal IN has not arrived, the first pull-down node N1 and the second pull-down node N2 are maintained at a high level, the pull-up node N3 is maintained at a low level, and the output terminal OUT continuously outputs an output signal at a high level.

In a period t3, the input signal terminal becomes a low level, the first clock signal terminal CLK1 is at a high level, and the second clock signal terminal CLK2 (and thus the input control signal terminal CON and the reset control signal terminal RESET) is at a low level. Therefore, the first transistor T1, the fifth transistor T5, and the seventh transistor T7 are turned on, and the second transistor T2 is turned off. The first pull-down node N1 becomes a low level, the second pull-down node N2 is still at a high level, and the pull-up node N3 is still at a low level. Thereby, the third transistor T3 and the sixth transistor T6 are maintained to be turned off, and the fourth transistor T4 is maintained to be turned on. At this time, the output to the output terminal OUT is a high level from the second constant voltage signal terminal VGH. The period t3 may also be referred to as an "input period".

In a period t4, the input process ends, the input signal at the input signal terminal IN becomes a high level, the first clock signal terminal CLK1 is at a low level, and the second clock signal terminal CLK2 (and thus the input control signal terminal CON and the reset control signal terminal RESET) is at a high level. Therefore, the first transistor T1, the fifth transistor T5 and the seventh transistor T7 are turned off, and the second transistor T2 is turned on. Due to the presence of the capacitor C1, the voltage at the first pull-down node N1 does not abruptly change and is still maintained to be at a low level. In a case where the second transistor T2 is turned on, the first pull-down node N1 is electrically coupled to the second pull-down node N2, so that the second pull-down node N2 also becomes a low level. Thereby, the third transistor T3 and the sixth transistor T6 are turned on. In a case where the third transistor T3 is turned on, the low level at the first constant voltage signal terminal VGL is transmitted to the output terminal OUT, and a voltage difference across the first capacitor C1 remains unchanged due to the bootstrap effect of the first capacitor C1. Thereby, the voltage at the first pull-down node N1 and the voltage at the second pull-down node N2 are further lowered, as shown in FIG. 5. In a case where the sixth transistor T6 is turned on, the high level at the second constant voltage signal terminal VGH is transmitted to the pull-up node N3, so that the pull-up node N3 is charged to a high level. Thereby, the fourth transistor T4 is turned off. At this time, the output to the output terminal OUT is a low level from the first constant voltage signal terminal VGL. The period t4 may also be referred to as an "output period".

In a period t5, the input signal at the input signal terminal IN is maintained at a high level, the first clock signal terminal CLK1 is at a high level, and the second clock signal terminal CLK2 (and thus the input control signal terminal CON and the reset control signal terminal RESET) is at a low level. Therefore, the first transistor T1, the fifth transistor T5, and the seventh transistor T7 are turned on, and the second transistor T2 is turned off. The first pull-down node N1 is charged to a high level by the input signal at a high level. The second pull-down node N2 is charged to a high level by the high level at the second constant voltage signal terminal VGH. The pull-up node N3 is pulled to a low level by the low level at the first constant voltage signal terminal VGL. Thereby, in a case where the second pull-down node N2 is at a high level, the third transistor T3 and the sixth transistor T6 are turned off. The low level at the first constant voltage signal terminal VGL is no longer input to the output terminal OUT. The fourth transistor T4 is turned on under action of the low level at the pull-up node N3, so that the high level at the second constant voltage signal terminal VGH may be transmitted to the output terminal OUT. At this time, the output to the output terminal OUT is a high level from the second constant voltage signal terminal VGH. The period t5 may also be referred to as a "reset period".

In a period t6, the input signal at the input signal terminal IN is maintained at a high level, and the nodes N1, N2, and N3 are maintained at a high level. Thereby, the output terminal OUT will be maintained at a high level.

Figure 6:
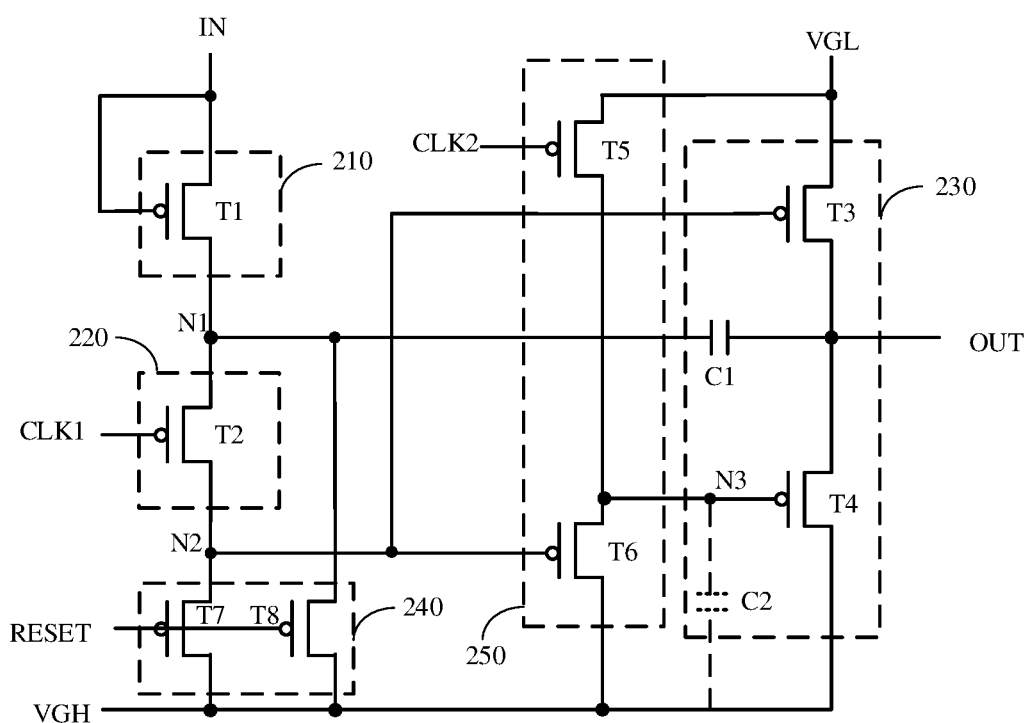
FIG. 6 illustrates a circuit diagram of a shift register unit according to another embodiment of the present disclosure.

FIG. 6 illustrates a circuit diagram of a shift register unit according to another embodiment of the present disclosure. The shift register unit of FIG. 6 is similar to that of FIG. 4, except that at least the input sub-circuit 210 and the reset sub-circuit 240 of FIG. 6 are different from those of FIG. 4.

As shown in FIG. 6, the input signal terminal IN of the input sub-circuit 210 is multiplexed as the input control signal terminal, so that an input signal at the input signal terminal IN is also used as an input control signal. In FIG. 6, the input sub-circuit 210 comprises a first transistor T1. The first transistor T1 has a gate and a first electrode coupled to the input control signal terminal CON for providing the input signal, and a second electrode coupled to the first pull-down node N1. Thereby, the first transistor T1 is turned on or turned off under control of the signal (which acts as both the input control signal and the input signal) received at the input signal terminal IN, and in a case where the first transistor T1 is turned on (the input signal terminal IN is at a low level), the first transistor T1 inputs the signal at the input signal terminal IN to the first pull-down node N1.

The first control sub-circuit 220 comprises a second transistor T2. The second transistor T2 has a gate coupled to the first clock signal terminal CLK1 to receive the first clock signal, a first electrode coupled to the first pull-down node N1, and a second electrode coupled to the second pull-down node N2. Thereby, the second transistor T2 is turned on or turned off under control of a first clock signal received at the first clock signal terminal CLK1. In a case where the second transistor T2 is turned on, the second transistor T2 electrically couples the first pull-down node N1 to the second pull-down node N2. In a case where the second transistor T2 is turned off, the second transistor T2 electrically isolates the first pull-down node N1 from the second pull-down node N2.

The output sub-circuit 230 comprises a third transistor T3, a fourth transistor T4, and a first capacitor C1. The third transistor T3 has a gate coupled to the second pull-down node N2, a first electrode coupled to the first constant voltage signal terminal VGL, and a second electrode coupled to the output terminal OUT. Thereby, the third transistor T3 is turned on or turned off under control of a voltage at the second pull-down node N2. In a case where the third transistor T3 is turned on, the third transistor T3 transmits a low level at the first constant voltage signal terminal VLG to the output terminal OUT to be output as an output signal.

The fourth transistor T4 has a gate coupled to the pull-up node N3, a first electrode coupled to the second constant voltage signal terminal VGH, and a second electrode coupled to the output terminal OUT. Thereby, the fourth transistor T4 is turned on or turned off under control of a voltage at the pull-up node N3. In a case where the fourth transistor T4 is turned on, the fourth transistor T4 transmits a high level at the second constant voltage signal terminal VGH to the output terminal OUT to be output as an output signal.

The first capacitor C1 has a first terminal coupled to the first pull-down node N1, and a second terminal coupled to the output terminal OUT. The first capacitor C1 is used to maintain a voltage difference between the first pull-down node N1 and the output terminal OUT, and enable formation of a gate-source voltage for causing the third transistor T3 to be turned on in a case where the first control sub-circuit 220 is turned on, so as to maintain a stable output at an active level for a certain period of time.

Also shown in FIG. 6 is that output sub-circuit 230 comprises a second capacitor C2. It should be understood that in other embodiments, the second capacitor C2 may not be included, and therefore C2 and its coupling relationship with the circuit are shown by dashed lines in FIG. 6. The second capacitor C2 may have one terminal coupled to the pull-up node N3, and the other terminal coupled to the second constant voltage signal terminal VGH. Thereby, the second capacitor C2 may be used to maintain a voltage difference between the pull-up node N3 and the second constant voltage signal terminal VGH in certain phases.

The second control sub-circuit 250 comprises a fifth transistor T5 and a sixth transistor T6. The fifth transistor T5 has a gate coupled to the second clock signal terminal CLK2 to receive the second clock signal, a first electrode coupled to the first constant voltage signal terminal VGL, and a second electrode coupled to the output terminal OUT. Thereby, the fifth transistor T5 is turned on or turned off under control of the second clock signal at the second clock signal terminal CLK2. In a case where the fifth transistor T5 is turned on, the fifth transistor T5 transmits the low level at the first constant voltage signal terminal VGL to the pull-up node N3.

The sixth transistor T6 has a gate coupled to the second pull-down node N2, a first electrode coupled to the second constant voltage signal terminal VGH to receive the second constant voltage signal, and a second electrode coupled to the pull-up node N3. Thereby, the sixth transistor T6 is turned on or turned off under control of the voltage at the second pull-down node N2. In a case where the sixth transistor T6 is turned on, the sixth transistor T6 transmits the high level at the second constant voltage signal terminal VGH to the pull-up node N3.

An active level (low level) or an inactive level (high level) may be provided to the pull-up node N3 by controlling turn-on or turn-off of the fifth transistor T5 and the sixth transistor T6, so as to control the transmission of the high level at the second constant voltage signal terminal VGH to the output terminal OUT.

The reset sub-circuit 240 comprises a seventh transistor T7 and an eighth transistor T8. The seventh transistor T7 has a gate coupled to the reset control signal terminal RESET to receive the reset control signal, a first electrode coupled to the second constant voltage signal terminal VGH to receive the second constant voltage signal, and a second electrode coupled to the second pull-down node N2. Thereby, the seventh transistor T7 is turned on or turned off under control of the reset control signal received at the reset control signal terminal RESET. In a case where the seventh transistor T7 is turned on, the seventh transistor T7 transmits the high level at the second constant voltage signal terminal VGH to the second pull-down node N2 to reset the second pull-down node. The eighth transistor T8 has a gate coupled to the reset control signal terminal RESET to receive the reset control signal, a first electrode coupled to the second constant voltage signal terminal VGH to receive the second constant voltage signal, and a second electrode coupled to the first pull-down node. Thereby, the eighth transistor T8 is turned on or turned off under control of the reset control signal received at the reset control signal terminal RESET. In a case where the eighth transistor T8 is turned on, the eighth transistor T8 transmits the high level at the second constant voltage signal terminal VGH to the first pull-down node N1 to reset the first pull-down node N1.

In the present embodiment, the reset control signal terminal RESET may be coupled to an output terminal of a next stage of shift register of the shift register unit 200 in a gate driving circuit to receive an output signal of the next stage of shift register as the reset control signal. Thereby, for the current stage of shift register unit, the reset control signal thereof is one clock cycle behind the input signal. A structure of the gate driving circuit may be a gate driving circuit described below with reference to FIG. 8B. It may be understood by those skilled in the art that the applicable gate driving circuit is not limited thereto.

Figure 7:
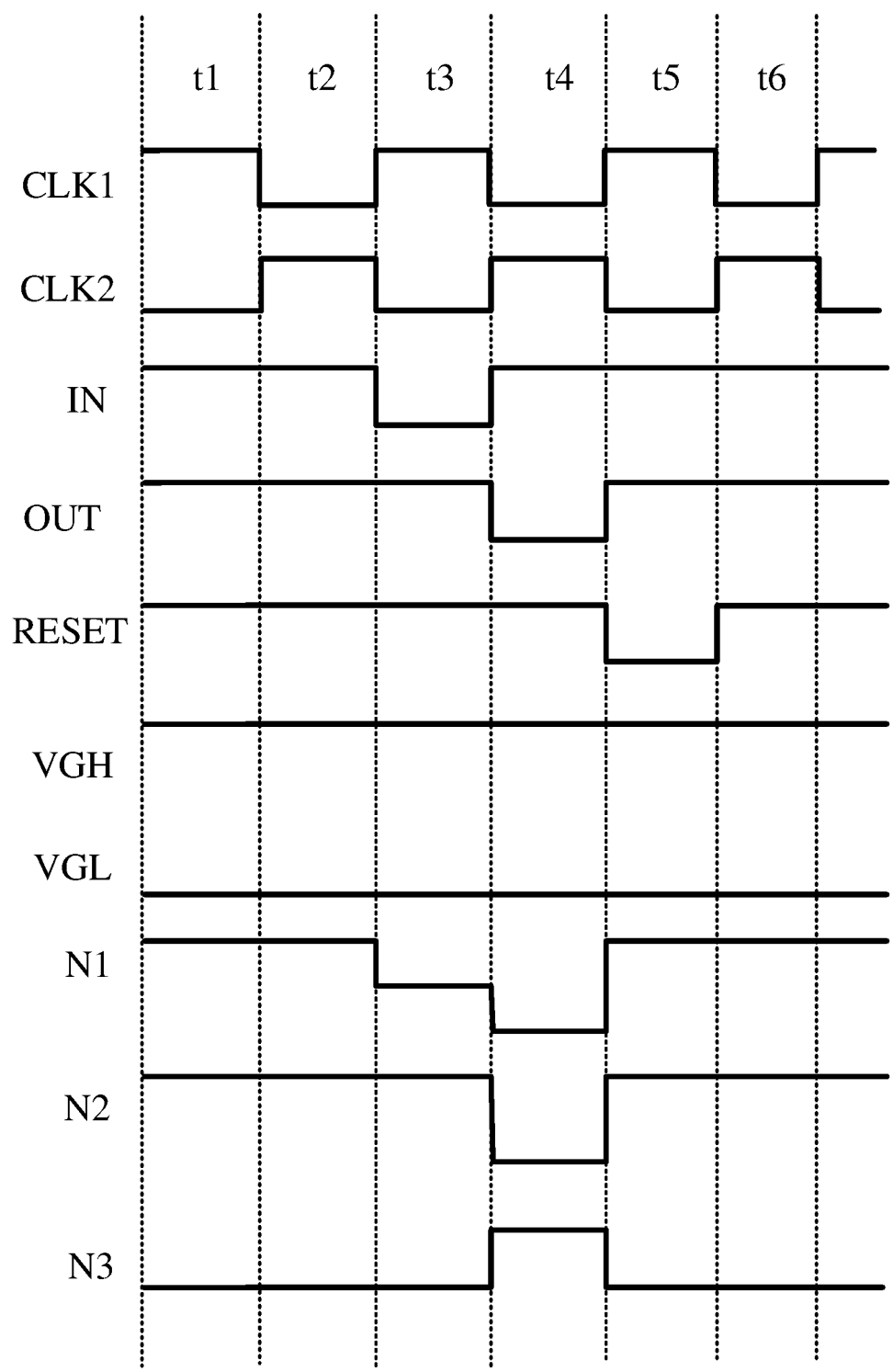
FIG. 7 illustrates a signal timing diagram of the shift register unit in FIG. 6.

FIG. 7 illustrates a signal timing diagram of the shift register unit 200 in FIG. 6. An operation of the shift register unit 200 in FIG. 6 will be described below in conjunction with FIG. 7.

In periods t1 and t2, similarly to the process described above with reference to FIG. 5, the first pull-down node N1 and the second pull-down node N2 are maintained at a high level, and the pull-up node N3 is maintained at a low level to wait for the arrival of an input signal at a low level.

In a period t3, the input signal terminal IN becomes a low level, the first clock signal terminal CLK1 is at a high level, the second clock signal terminal CLK2 is at a low level, and the reset control signal terminal RESET is at a high level. Therefore, the first transistor T1 and the fifth transistor T5 are turned on, and the second transistor T2, the seventh transistor T7, and the eighth transistor T8 are turned off. The first pull-down node N1 becomes a low level, the second pull-down node N2 is still at a high level, and the pull-up node N3 is still at a low level. Thereby, the third transistor T3 and the sixth transistor T6 are maintained to be turned off, and the fourth transistor T4 is maintained to be turned on. At this time, the output to the output terminal OUT is a high level from the second constant voltage signal terminal VGH. The period t3 may also be referred to as an "input period".

In a period t4, the input process ends, the input signal at the input signal terminal IN becomes a high level, the first clock signal terminal CLK1 is at a low level, the second clock signal terminal CLK2 is at a high level, and the reset control signal terminal RESET is still at a high level. Therefore, the first transistor T1, the fifth transistor T5, the seventh transistor T7 and the eighth transistor T8 are turned off, and the second transistor T2 is turned on. Due to the presence of the first capacitor C1, the voltage at the first pull-down node N1 does not abruptly change and is still maintained to be at a low level. In a case where the second transistor T2 is turned on, the first pull-down node N1 is electrically coupled to the second pull-down node N2, so that the second pull-down node N2 also becomes a low level. Thereby, the third transistor T3 and the sixth transistor T6 are turned on. In a case where the third transistor T3 is turned on, the low level at the first constant voltage signal terminal VGL is transmitted to the output terminal OUT, and a voltage difference across the first capacitor C1 remains unchanged due to the bootstrap effect of the first capacitor C1. Thereby, the voltage at the first pull-down node N1 and the voltage at the second pull-down node N2 are further lowered, as shown in FIG. 7. In a case where the sixth transistor T6 is turned on, the high level at the second constant voltage signal terminal VGH is transmitted to the pull-up node N3, so that the pull-up node N3 is at a high level. Thereby, the fourth transistor T4 is turned off. At this time, the output to the output terminal OUT is a low level from the first constant voltage signal terminal VGL. The period t4 may also be referred to as an "output period".

In a period t5, the input signal terminal IN is maintained at a high level, the first clock signal terminal CLK1 is at a high level, the second clock signal terminal CLK2 is at a low level, and the reset control signal terminal RESET becomes a low level. Therefore, the fifth transistor T5, the seventh transistor T7 and the eighth transistor T8 are turned on, and the first transistor T1 and the second transistor T2 are turned off. The first pull-down node N1 and the second pull-down node N2 are both reset to the high level at the second constant voltage signal terminal VGH. The low level at the first constant voltage signal terminal VGL is provided to the pull-up node N3. Thereby, in a case where the second pull-down node N2 becomes a high level, the third transistor T3 and the sixth transistor T6 are turned off. The high level at the second constant voltage signal terminal VGH is no longer input to the output terminal OUT. The fourth transistor T4 is turned on under action of the low level at the pull-up node N3, so that the high level at the second constant voltage signal terminal VGH may be transmitted to the output terminal OUT. At this time, the output to the output terminal OUT is a high level from the second constant voltage signal terminal VGH. The period t5 may also be referred to as a "reset period".

In a period t6, the input signal terminal IN is maintained at a high level, and the nodes N1, N2, and N3 are maintained at a high level. Thereby, the output terminal OUT will be maintained at a high level.

Differently from FIG. 5, in the embodiment of FIG. 7, the reset control signal terminal RESET provides a separate reset control signal instead of using the second clock signal as the reset control signal. As shown in FIG. 7, in other periods than the period t5, the reset control signal at the reset control signal terminal RESET is at a high level, and the seventh transistor T7 and the eighth transistor T8 are maintained to be in a turn-off state, thus not affecting potentials at the first pull-down node N1 and the second pull-down node N2. In the period t5, the reset control signal at the reset control signal terminal RESET is at a low level, and the seventh transistor T7 and the eighth transistor T8 are turned on, to pull up the first pull-down node N1 and the second pull-down node N2 to the high level at the constant voltage signal terminal VGH respectively.

Figure 8A:
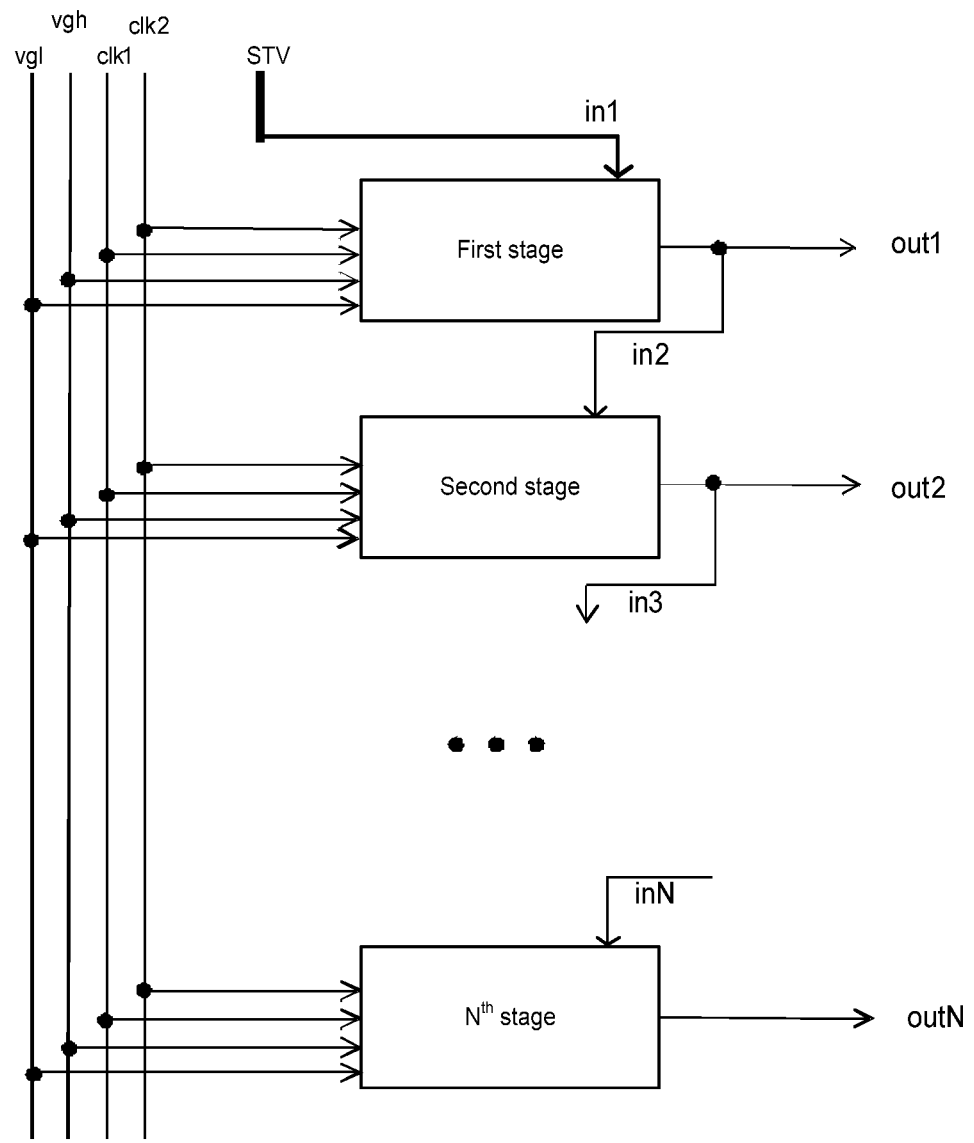
FIG. 8A illustrates a schematic block diagram of a gate driving circuit according to an embodiment of the present disclosure.

FIG. 8A illustrates a cascade diagram of a gate driving circuit according to an embodiment of the present disclosure. As shown in FIG. 8A, the gate driving circuit comprises N cascaded shift register units (for example, the shift register units shown in FIG. 4). Here, except for a first stage of shift register unit, each stage of shift register unit receives an output signal of a previous stage of shift register unit as an input signal of the current stage of shift register unit, and the first stage of shift register unit receives a frame start signal STV as an input signal. Further, each stage of shift register unit receives clock signals clk1 and clk2 and constant voltage signals vgh and vgl. As shown in FIG. 8A, an input signal terminal of the first stage of shift register unit receives the frame start signal STV as an input signal in1, an input signal terminal of a second stage of shift register unit is coupled to an output signal terminal of the first stage of shift register unit to receive an output signal out1 of the first stage of shift register unit as an input signal in1, and so on, and an $n^{th}$ stage of shift register unit receives an output signal out(n-1) of an $(n-1)^{th}$ stage of shift register unit as an input signal in(n) of the $n^{th}$ stage of shift register unit, where n and N are integers, N≥2, and 2≤n≤N. A first clock signal terminal of each stage of shift register unit is coupled to receive a first clock signal clk1, a second clock signal terminal of each stage of shift register unit is coupled to receive a second clock signal clk2, a first constant voltage signal terminal of each stage of shift register unit is coupled to receive a first constant voltage signal Vgl, and a second constant voltage signal terminal of each stage of shift register unit is coupled to receive a second constant voltage signal vgh. In the present embodiment, the first constant voltage signal may be at a constant low level, the second constant voltage signal may be at a constant high level, and the first clock signal clk1 is an inverted signal of the second clock signal c1$k$2.

Figure 8B:
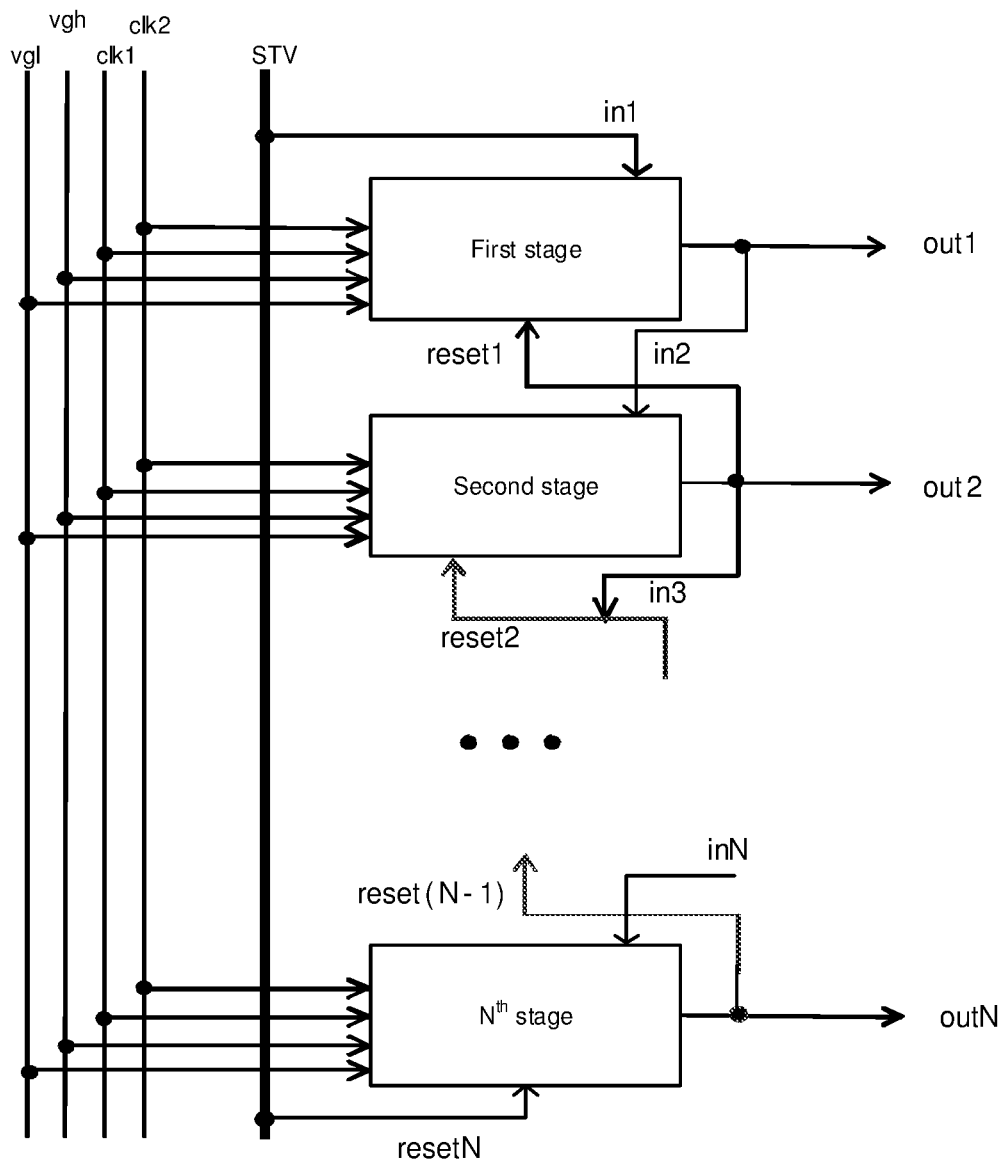
FIG. 8B illustrates a schematic block diagram of a gate driving circuit according to another embodiment of the present disclosure.

FIG. 8B illustrates a cascade diagram of a gate driving circuit according to another embodiment of the present disclosure. As shown in FIG. 8B, the gate driving circuit comprises N cascaded shift register units (for example, the shift register units shown in FIG. 6). Here, except for a first stage of shift register unit, each stage of shift register unit receives an output signal of a previous stage of shift register unit as an input signal of the current stage of shift register unit, and the first stage of shift register unit receives a frame start signal STV as an input signal. As shown in FIG. 8B, an input signal terminal of the first stage of shift register unit receives a frame start signal STV as an input signal in1, an input signal terminal of a second stage of shift register unit receives an output signal out1 of the first stage of shift register unit as an input signal in1, and so on, and an $n^{th}$ stage of shift register unit receives an output signal out(n-1) of an $(n-1)^{th}$ stage of shift register unit as an input signal in(n) of the $n^{th}$ stage of shift register unit, where n and N are integers, N≥2, and 2≤n≤N. In addition, the respective stages of the shift register units receive clock signals clk1 and c1$k$2 and constant voltage signals vgh and vgl in a manner similar to that described above with reference to FIG. 8A.

In FIG. 8B, except for a last stage of shift register unit, each stage of shift register unit receives an output signal from a next stage of shift register unit as a reset control signal of the current stage of shift register unit, and the last stage of shift register unit receives a frame start signal STV as a reset control signal. For example, the first stage of shift register unit receives an output signal out2 from the second stage of shift register unit as a reset control signal reset1 of the first stage of shift register unit, the second stage of shift register unit receives an output signal out3 from the third stage of shift register unit as a reset control signal reset2 of the second stage of shift register unit, and so on.

Figure 9:
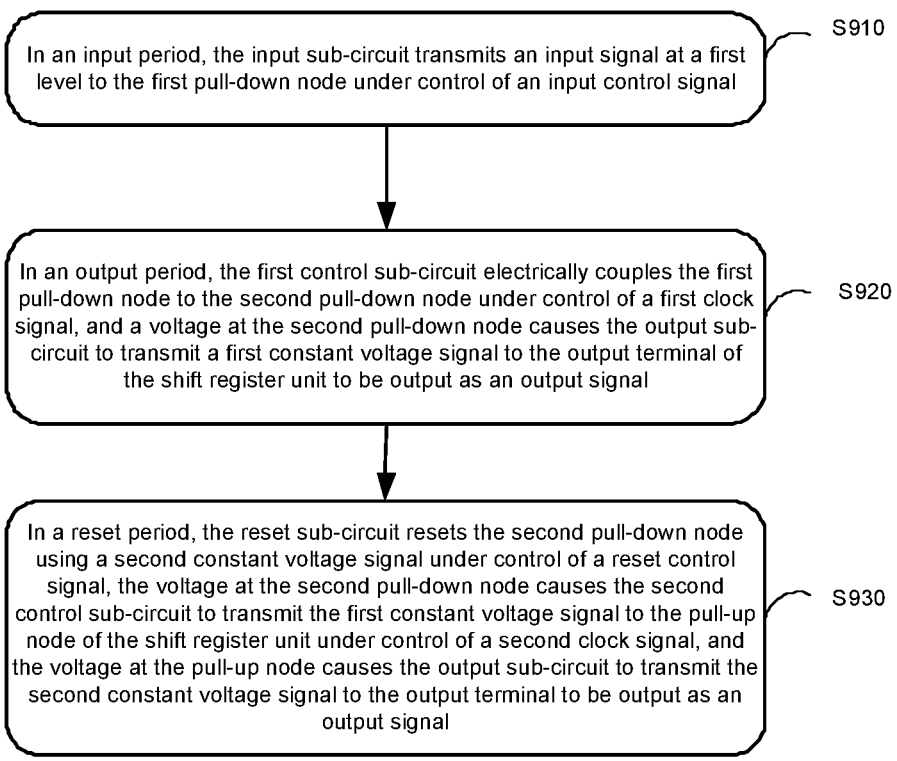
FIG. 9 illustrates a flowchart of a method for driving a shift register unit according to an embodiment of the present disclosure.

FIG. 9 illustrates a flowchart of a method 900 for driving a shift register unit according to an embodiment of the present disclosure. The method 900 may be used to drive the shift register unit shown in FIG. 2, FIG. 3, FIG. 4 or FIG. 6.

As shown in FIG. 9, in step S910, in an input period, the input sub-circuit transmits an input signal at a first level to the first pull-down node under control of an input control signal. For example, as described above, the input sub-circuit may charge the first pull-down node to a first active level, and the first control sub-circuit and the reset sub-circuit maintain the second pull-down node at an inactive level (high level).

In step S920, in an output period, the first control sub-circuit electrically couples the first pull-down node to the second pull-down node under control of a first clock signal, and a voltage at the second pull-down node causes the output sub-circuit to transmit a first constant voltage signal to the output terminal of the shift register unit to be output as an output signal.

In some embodiments, the method may further comprise step S930. In step S930, in a reset period, the reset sub-circuit resets the second pull-down node, to for example, an inactive level, using a second constant voltage signal under control of a reset control signal. The voltage at the second pull-down node causes the second control sub-circuit to transmit the first constant voltage signal to the pull-up node of the shift register unit under control of a second clock signal, and the voltage at the pull-up node causes the output sub-circuit to transmit the second constant voltage signal to the output terminal to be output as an output signal.

In the above process, at least one of the reset control signal or the input control signal may be implemented by the second clock signal. In some embodiments, the first pull-down node is further reset by the reset control signal to an inactive level in the reset period. In some other embodiments, the first pull-down node is further reset by the input control signal to an inactive level in the reset period.

The signal timings of the shift register unit described above with reference to FIGS. 5 and 7 are also applicable to the above method 900, and details thereof will not be described herein again.

The shift register unit and the gate driving circuit according to the embodiments of the present disclosure may be applied to various display devices, for example, display devices based on OLED technology, such as Active Matrix Organic Light Emitting Diode (AMOLED) display devices. Of course, the present disclosure is not limited thereto, and the embodiments of the present disclosure are also applicable to display devices based on Liquid Crystal Device (LCD) technology.

Figure 10:
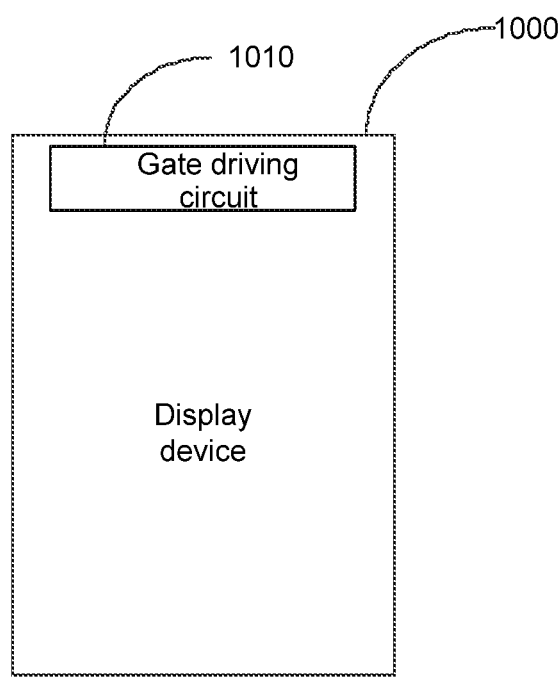
FIG. 10 illustrates a schematic block diagram of a display device according to an embodiment of the present disclosure.

FIG. 10 illustrates a schematic block diagram of a display device according to an embodiment of the present disclosure. As shown in FIG. 10, the display device 1000 comprises a gate driving circuit 1010. The gate driving circuit 1010 may be implemented by the gate driving circuit according to any of the embodiments of the present disclosure. The display device 1000 according to the embodiment of the present disclosure may be any product or component having a display function such as an electronic paper, a mobile phone, a tablet computer, a television, a display, a notebook computer, a digital photo frame, a navigator, etc.

The foregoing detailed description has set forth various embodiments via the use of diagrams, flowcharts, and/or examples. In a case where such diagrams, flowcharts, and/or examples contain one or more functions and/or operations, it should be understood by those skilled in the art that each function and/or operation within such diagrams, flowcharts or examples may be implemented, individually and/or collectively, by a wide range of structures, hardware, software, firmware, or virtually any combination thereof.

Although the present disclosure has been described with reference to a few exemplary embodiments, it should be understood that the terms used are illustrative and exemplary and not restrictive. Since the present disclosure may be embodied in a variety of forms without departing from the spirit or scope of the present disclosure, it should be understood that the above-described embodiments are not limited to any details described above, but are construed broadly within the spirit and scope defined by the appended claims.

Therefore, all changes and modifications which fall within the scope of the claims or the equivalents thereof are intended to be covered by the appended claims.

I claim:

1. A shift register unit, comprising:
an input sub-circuit electrically coupled to a first pull-down node of the shift register unit, and configured to receive an input control signal and an input signal, and transmit the input signal to the first pull-down node under control of the input control signal;
a first control sub-circuit electrically coupled to the first pull-down node and a second pull-down node of the shift register unit, and configured to receive a first clock signal and electrically couple the first pull-down node to the second pull-down node of the shift register unit under control of the first clock signal;
an output sub-circuit electrically coupled to the second pull-down node, the first pull-down node, and an output terminal of the shift register unit, and configured to receive a first constant voltage signal and transmit the first constant voltage signal to the output terminal to be output as an output signal based on a voltage at the first pull-down node under control of a voltage at the second pull-down node; and
a second control sub-circuit electrically coupled to the second pull-down node and a pull-up node of the shift register unit, and configured to receive the first constant voltage signal, a second constant voltage signal, and a second clock signal and transmit the first constant voltage signal or the second constant voltage signal to the pull-up node under control of the second clock signal and the voltage at the second pull-down node,
wherein the second control sub-circuit comprises a fifth transistor and a sixth transistor, wherein:
the fifth transistor has a gate electrically coupled to receive the second clock signal, a first electrode electrically coupled to receive the first constant voltage signal, and a second electrode electrically coupled to the pull-up node; and
the sixth transistor has a gate directly connected to the second pull-down node, a first electrode electrically coupled to receive the second constant voltage signal, and a second electrode electrically coupled to the pull-up node.

2. The shift register unit according to claim 1, wherein the output sub-circuit is further electrically coupled to the pull-up node, and is further configured to receive the second constant voltage signal and transmit the second constant voltage signal to the output terminal to be output as the output signal under control of a voltage at the pull-up node.

3. The shift register unit according to claim 2, wherein the output sub-circuit comprises a third transistor, a fourth transistor, and a first capacitor, wherein
the third transistor has a gate electrically coupled to the second pull-down node, a first electrode electrically coupled to receive the first constant voltage signal, and a second electrode electrically coupled to the output terminal;
the fourth transistor has a gate electrically coupled to the pull-up node, a first electrode electrically coupled to receive the second constant voltage signal, and a second electrode electrically coupled to the output terminal; and
the first capacitor has a first terminal electrically coupled to the first pull-down node, and a second terminal electrically coupled to the output terminal.

4. The shift register unit according to claim 3, wherein the output sub-circuit further comprises a second capacitor having a first terminal electrically coupled to the pull-up node, and a second terminal electrically coupled to receive the second constant voltage signal.

5. The shift register unit according to claim 1, further comprising:
a reset sub-circuit electrically coupled to the second pull-down node, and configured to receive a reset control signal and a second constant voltage signal, and reset the second pull-down node using the second constant voltage signal under control of the reset control signal.

6. The shift register unit according to claim 5, wherein the reset sub-circuit comprises a seventh transistor having a gate electrically coupled to receive the reset control signal, a first electrode electrically coupled to receive the second constant voltage signal, and a second electrode electrically coupled to the second pull-down node.

7. The shift register unit according to claim 6, wherein the reset control signal is a second clock signal.

8. The shift register unit according to claim 6, wherein the reset sub-circuit further comprises an eighth transistor having a gate electrically coupled to receive the reset control signal, a first electrode electrically coupled to receive the second constant voltage signal, and a second electrode electrically coupled to the first pull-down node.

9. The shift register unit according to claim 8, wherein the reset control signal is an output signal from another shift register unit.

10. The shift register unit according to claim 1, wherein the input sub-circuit comprises a first transistor having a gate electrically coupled to receive the input control signal, a first electrode electrically coupled to receive the input signal, and a second electrode electrically coupled to the first pull-down node.

11. The shift register unit according to claim 10, wherein the input control signal is a second clock signal or the input signal.

12. The shift register unit according to claim 1, wherein the first control sub-circuit comprises a second transistor having a gate electrically coupled to receive the first clock signal, a first electrode electrically coupled to the first pull-down node, and a second electrode electrically coupled to the second pull-down node.

13. A gate driving circuit comprising N stages of cascaded shift register units according to claim 1, wherein an $n^{th}$ stage of shift register unit receives an output signal from an $(n-1)^{th}$ stage of shift register unit as an input signal of the $n^{th}$ stage of shift register unit, where n and N are integers, $N \geq 2$, and $2 \leq n \leq N$.

14. The gate driving circuit according to claim 13, wherein each stage of shift register unit receives a second clock signal as a reset control signal; or
the $N^{th}$ stage of shift register unit receives an output signal from an $(n+1)^{th}$ stage of shift register unit as a reset control signal of the $n^{th}$ stage of shift register unit.

15. A display device comprising the gate driving circuit according to claim 13.

16. A method for driving the shift register unit according to claim 1, comprising:
transmitting, in an input period, by the input sub-circuit, an input signal at a first level to the first pull-down node under control of an input control signal; and
electrically coupling, in an output period, by the first control sub-circuit, the first pull-down node to the second pull-down node under control of a first clock signal, and causing, by a voltage at the second pull-down node, the output sub-circuit to transmit a first constant voltage signal to the output terminal of the shift register unit to be output as an output signal.

17. The method according to claim 16, wherein the shift register unit further comprises a reset sub-circuit and a second control sub-circuit, the method further comprising:
resetting, in a reset period, by the reset sub-circuit, the second pull-down node using a second constant voltage signal under control of a reset control signal, causing, by the voltage at the second pull-down node, the second control sub-circuit to transmit the first constant voltage signal to the pull-up node of the shift register unit under control of a second clock signal, and causing, by a voltage at the pull-up node, the output sub-circuit to transmit the second constant voltage signal to the output terminal to be output as an output signal.

18. The method according to claim 17, wherein at least one of the reset control signal or the input control signal is the second clock signal.

* * * * *